United States Patent [19]
Hom-Ma et al.

[11] 4,025,411
[45] May 24, 1977

[54] FABRICATING SEMICONDUCTOR DEVICE UTILIZING A PHYSICAL ION ETCHING PROCESS

[75] Inventors: Yoshio Hom-Ma, Kokubunji; Tadao Kaji, Tokyo, both of Japan

[73] Assignee: Hitachi, Ltd., Japan

[22] Filed: Oct. 28, 1975

[21] Appl. No.: 626,277

[30] Foreign Application Priority Data

Oct. 25, 1974 Japan .............................. 49-122559
Oct. 18, 1975 Japan .............................. 50-125752

[52] U.S. Cl. ............................ 204/192 E; 156/625; 156/643; 156/664; 156/655; 156/656
[51] Int. Cl.² ........................................ H01L 21/312
[58] Field of Search ..................... 156/2, 3, 17, 18; 204/192 E; 96/36

[56] References Cited
UNITED STATES PATENTS

| 3,506,506 | 4/1970 | Pennabaker | 156/17 |
| 3,700,497 | 10/1972 | Epifano et al. | 156/17 |
| 3,740,280 | 6/1973 | Ronen | 156/17 |
| 3,791,858 | 2/1974 | McPherson et al. | 156/3 |
| 3,816,196 | 6/1974 | LaCombe | 156/2 |
| 3,919,066 | 11/1975 | Johannas et al. | 204/192 E |

*Primary Examiner*—William A. Powell
*Assistant Examiner*—Jerome W. Massie
*Attorney, Agent, or Firm*—Craig & Antonelli

[57] ABSTRACT

An even surface of an $SiO_2$ layer on an Si body, whose surface is uneven, is obtained by the steps of forming a photoresist layer of KTFR (Trade name of Eastman Kodak Chemical Company) on the uneven surface of the $SiO_2$ layer so as to have a thickness sufficient cover the unevenness of the surface and etching the $SiO_2$ layer with said KTFR layer by rf sputter etching so as to expose a predetermined surface of the $SiO_2$ layer.

16 Claims, 20 Drawing Figures

FABRICATING SEMICONDUCTOR DEVICE UTILIZING A PHYSICAL ION ETCHING PROCESS

FIELD OF THE INVENTION

This invention relates to a method for obtaining an even surface of a substrate in a process for fabricating a semiconductor device.

BACKGROUND OF THE INVENTION

In a method for fabricating a semiconductor device, in processes such as a process of diffusion of impurities, of forming insulating layers, surface treatments by etching have been employed. According to these processes, on a surface of a semiconductor body, insulating layers having protuberances and/or step-like cross-sections (hereafter, these are called uneven surface) are formed. That is, a surface of a substrate which includes insulating layers, wirings, etc., and on which other components for the semiconductor device are to be formed, is an uneven surface. For example, when wirings are formed on the surface of the body, the surface of the substrate becomes uneven. Therefore, when multilevel interconnections, for example, are formed on the uneven surface of the substrate, the multilevel interconnections to be formed also have an uneven surface due to the uneven surface of the substrate, and hence the more external is the interconnection, the more non-uniform the thickness of the interconnection becomes. When the non-uniformity becomes extreme, the interconnection often breaks at a certain portion. This defect lowers the reliability of the semiconductor devices. For improving the reliability of the semiconductor devices, thicker interconnections are generally utilized.

SUMMARY OF THE INVENTION

It is an object of the present invention to provide a method for fabricating a semiconductor device having a high reliability.

It is another object of the present invention to provide a method for forming a flat surface of a substrate on which other components for a semiconductor device are to be formed.

These objects of the present invention are attained by the steps of making an uneven surface of the substrate even by a material which has about the same etching rate with respect to physical etching, such as an ion etching, a rf sputtering etc. as that material composing the uneven surface, and of etching the substrate whose surface is made even by the physical etching method until a predetermined portion of the substrate is exposed.

For better understanding of the present invention, a conventional method for fabricating a planar transistor will be explained with reference to FIGS. 1a to 1d.

DESCRIPTION OF THE PRIOR ART

Recently, planar techniques have been employed in a method for fabricating a semiconductor device. This technique includes the steps of preparing a semiconductor body having an even surface, providing an insulating layer on the even surface of the body, making holes at a predetermined portions of the insulating layer by a photolithographical technique, and diffusing impurities into the body through the holes.

FIGS. 1a to 1d are schematic sectional views of a planar transistor in an integrated circuit device for explaining a conventional method for fabricating a semiconductor device.

Figure 1A:
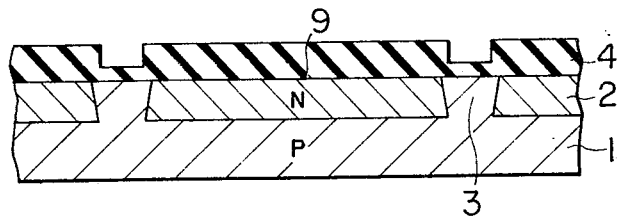
FIGS. 1a to 1d are schematic sectional views for explaining a conventional method for fabricating a planar transistor.

FIG. 1a is for showing a step of diffusing impurities for isolation.

On a surface of a p-type Si body 1, and n-type Si layer 2 is epitaxially grown. A silicon oxide film 4 is formed on the surface 9 of the n-type Si layer 2 by a thermal oxidation method, and prescribed portions of the silicon oxide film 4 are etched away so as to expose prescribed portions of the n-type Si layer 2, by a photolithographical technique. Then isolation regions 3 of p conductivity are formed in the n-type Si layer 2 by diffusing impurities into the n-type Si layer 2 from the exposed portions of the n-type Si layer 2 so as to reach the p-type Si body 1. During this diffusion step, new silicon oxide films are formed on the exposed portions of the n-type Si layer 2.

Figure 1B:
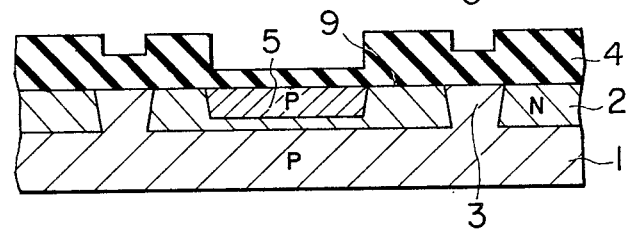

FIG. 1b is for showing a step of forming a base region.

A portion of the silicon oxide film 4 corresponding to the isolated n-type Si layer 2 is etched away so as to expose a portion of the surface of the n-type Si layer 2 by the photolithographical technique, and then a p-type region 5 which acts as a base is formed in the n-type Si layer 2 by diffusing impurities into the n-type Si layer 2 from the exposed surface of the n-type Si layer 2. During this step, new silicon oxide film is formed on the exposed surface of the n-type Si layer 2.

Figure 1C:
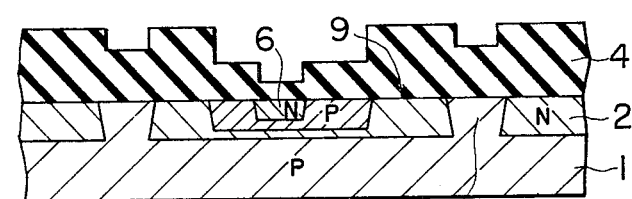

FIG. 1c is for showing a step of forming an emitter region.

A prescribed portion of the new silicon oxide film formed on the exposed surface of the n-type Si layer 2 is etched away so as to expose a portion of the surface of the p-type region 5 by the photolithographical technique, and then impurities are diffused into the p-type region 5 from the exposed surface of the p-type region 5, so as to form an n-type region 6 which acts as an emitter. During this step, new silicon oxide film is formed on the exposed surface of the p-type region 5.

Figure 1D:
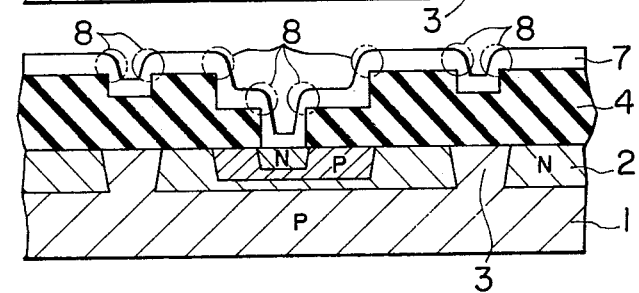

FIG. 1d is for showing a step of forming a wiring for the emitter.

A prescribed portion of the new silicon oxide formed on the exposed surface of the p-type region 5 is etched away by the photolithographical technique so as to expose a part of the surface of the n-type region 6, and then aluminum is evaporated on the silicon oxide film 4 and on the exposed surface of the n-type region 6, whereby the wiring 7 of aluminum for the n-type region 6, that is the emitter is formed.

As stated above, since the planar technique includes continuous selective diffusion steps, in each of which the new silicon oxide film is required, the surface of the substrate on which the wirings are to be formed becomes a step-like structure as shown in FIG. 1c.

This step-like structure of the substrate surface causes a problem for the wirings, that is, breakage of the wirings. As is shown in FIG. 1d, at the edges 8 of the steps of the insulating film 4, the wiring 7 becomes thin, and it causes breakage of the wiring 7. This is a big problem for the reliability of the semiconductor device.

For solving this problem, it has been proposed that a method for evaporating a metal for forming the wirings wherein a plurality of sources of metal for evaporation, and a method for etching the edges of the steps of the insulating film. These proposed methods, however, have not yet brought about sufficient results.

The step-like structure of the substrate surface also causes a problem that the integration density is limited, since unwanted light is reflected at the steps of the insulating film in the step of exposing a photoresist and hence the accuracy of patterns is lowered.

It has been proposed in Japanese Laid Open Patent Publication 50-24079 that the protuberance of the insulating film be removed by a reverse sputtering method, and hence the surface of the substrate is made even, for solving breakage of the insulating film formed on the wiring.

This method, however, requires a long period of time, and, in many cases, it is impractical to make the substrate surface even. For example, it requires rf sputtering for about 1 day to remove the protuberance of silicon dioxide having a width of from 10μm to 40μm. Therefore, it is impractical to adopt this method in the fabrication of the semiconductor devices.

The present invention is proposed to provide a method for making uneven surface of the substrate even completely or in a range wherein no practical problems are caused.

One of the effects of the present invention is to increase the reliability of layers to be formed on the substrate surface, and also to increase the reliability of the semiconductor device, since the un-uniformity of the layers and the breaks of the layers are completely prevented by the present invention.

Another effect of the present invention is that small-sized semiconductor devices can be formed, since thin wirings can be employed. For example, the thickness of the wiring on the substrate surface having a step of about 0.5μm is about 0.8 – 1μm when the reliability of the wiring is considered, and, on the other hand, it is sufficient that the thickness of the wiring on the even surface of the substrate is about 0.5μm, and hence the accuracy of the minute processing thereof is increased by 1.5 times as that of the wiring on the stepped substrate surface.

Therefore, the present invention is very useful for planar type or semi-planar type wirings being developed rapidly.

DETAILED DESCRIPTION OF THE INVENTION

The essence of the present invention will be explained with reference to FIGS. 2a to 2c.

Here, a method for removing protuberances C and D of the semiconductor body 21 will be explained.

Figure 2A:
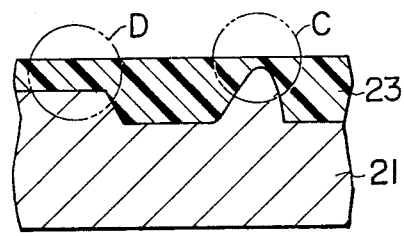
FIGS. 2a to 2c are schematic sectional views of a semiconductor device for explaining the fundamental steps of a method of the present invention.

On the surface of the semiconductor body 21 which has protuberances C and D, a layer 23 consisting of a material which is in a liquid state when it is applied and has about same etching rate with respect to a physical etching as that of the semiconductor body 21 when it is in a solid state, is formed (FIG. 2a).

Since the material for the layer 23 is in the liquid state when it is applied to the surface of the body 21, the material intrudes easily into dents and hence the uneven surface of the body 21 is made even with the layer 23 as shown in FIG. 2a. The thickness of the layer 23 is at least the thickness (or height) of the protuberance of the body 21. The layer 23 is completed when the material in the liquid state is solidified by drying and/or heating the applied material.

A physical etching utilizing ions is adopted to thus formed device for etching the surface thereof.

Figure 2C:
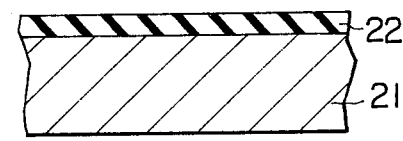
Figure 2B:
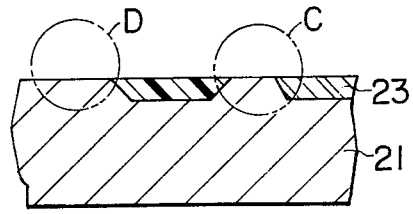

First the upper portion of the layer 23 is etched and then, with the layer 23, the protuberance C and D of the semiconductor body 21 are etched as shown in FIG. 2b.

The physical etching is continued until the protuberances are removed with the layer 23, whereby the even surface of the body is obtained, as shown in FIG. 2c wherein an insulating film 22 is formed on the even surface of the body 21.

After the even surface of the body is obtained, semiconductor devices are formed by employing conventional steps for fabricating semiconductor devices, such as steps of forming insulating films, diffusing impurities, forming wirings, etc.

Generally, the surface of the substrate consists of Si, $SiO_2$, phospho-silicate glass (PSG), boro-silicate glass (BSG), $Si_3N_4$ or aluminum. Therefore, the layer 23 should have about the same etching rate with respect to the physical etching as that of above said material, such as Si.

It will be apparent that the difference between the etching rates of the layer 23 and of the material of the substrate surface is as small as possible. However, practically, a material having the etching rate being in a range of ±50% of the etching rate of the material of the substrate surface may be utilized for the layer 23, and it is more preferable to utilize a material for the layer 23, which has the etching rate being in a range of ±30% of the etching rate of the material of the substrate surface.

Since the thicknesses of protuberances of the substrate are generally in the range of between 0.7μm and 1μm, when the etching rate of the layer 23 is of ±30% of that of the protuberance, the thicknesses of the protuberances after they were etched become in the range of between 0.2μm and 0.3μm. The substrate surface having protuberances whose thicknesses are 0.2μm – 0.3μm is deemed practically as the even surface.

According to the inventors' experiments, it has been recognized that the following materials are preferable for the layer 23, when materials of the substrate surface are Si, $SiO_2$, PSG, BSG, $Si_3N_4$ or aluminum.

1. negative-type photoresists, such as KTFR (Trade name of Eastman Kodak Chemical Company), KMER (Trade name of Eastman Kodak Chemical Company), OMR (Trade name of Tokyo Ohka Kogyo Co., Ltd.), and Waycote (Trade name of Philip-A. Hunt Chemical Company).
2. positive-type photoresists, such as AZ 1350 (Trade name of Shipley Company), AZ 1350H (Trade name of Shipley Company), and AZ 111 (Trade name of Shipley Company).
3. positive-type resists for electron beams, such as poly(methyl methacrylate) and poly(butene-1 sulfone).
4. negative-type resists for electron beams, such as epoxidized polybutadiene, copolymer of glycidyl methacrylate and ethyl acrylate, and poly(glycidyl methacrylate).
5. polyimide resin and polyimide-iso-indroquinazolinedione resin.
6. low temperature fusible glass being able to be coated, such as IWF T-020 (Trade name of Iwaki Glass-Kabushiki-Kaisya).

Among these materials, for the Si substrate, negative-type photoresists, positive-type photoresists, positive-type resists for electron beams and negative-type resists for electron beams are more preferable, and positive-type photoresists are most suitable.

For the substrate of $SiO_2$, $Si_3N_4$, PSG or BSG, it is preferable to utilize negative-type photoresists, polyimide resin or polyimide-iso-indroquinazolinedione resin for the layer 23, and, for the substrate of aluminum, positive-type photoresist, positive-type resists for electron beams and negative-type resists for electron beam are preferable.

The step of applying resists and resins on the substrate surface is the same as the conventional step of applying resists and resins on any kinds of substrates.

Typical physical etching methods utilizing ions which can be adopted in the present invention are the sputter etching method and the ion milling method which are well known in the art.

When the layer applied on the substrate is of dielectric material, it is preferable to utilize the rf sputter etching method which is one of the sputter etching method.

Preferable conditions for the rf sputter etching are as follows:
1. rf Power: 0.1 – 10W/cm² (preferably 0.1 – 5W/cm²)
2. Sheath Potential: lower than 2000V (preferably 700 – 1500V)
3. Ar Pressure: $5 \times 10^{-2} - 1 \times 10^{-4}$ Torr.
4. Oxygen Concentration: lower than 0.1%
5. Substrate Temperature: lower than the melting temperature of the material applied on the substrate surface; ~ 450° C for polyimide-iso-indroquinazolinedione resin; ~ 400° C for polyimide resin; ~ 200° C – 300° C for resists, (preferably 100° C –200° C).

When the sheath potential is higher than 2000 V, pinholes are generated in the layer coated on the substrate, and when the oxygen concentration is higher than 0.1%, resins and resists are etched rapidly, and hence it becomes difficult to control for obtaining the even surface of the substrate.

Preferable conditions for the ion milling are as follows:
1. Ion Energy: 20 eV – 90 KeV (preferably 20 eV – 30 KeV; more preferably 3 KeV – 10 KeV)
2. Degree of Vacuum: $1 \times 10^{-3} - 5 \times 10^{-6}$ Torr.
3. Substrate Temperature: Same as that in the rf sputtering.
4. Current Density: 0.5 – 5 mA/cm.

When the ion energy is lower than 20 eV, the layer applied on the substrate surface is not effectively etched, and when the ion energy is higher then 90 KeV, the layer is damaged and hence it is unsuitable for obtaining the even surface of the substrate. The higher the current density is, the higher the etching speed becomes. For obtaining the even surface of the substrate, the current density does not give a great influence.

Tables 1 and 2 show relative etching rates of some materials of the substrate and of the layer to be formed on the substrate. The relative eaching rate is the rate between etching rates of the materials and of $SiO_2$.

In Table 1, relative etching rates which are measured when the materials are etched by the rf sputter etching method whose conditions are: the rf power of 3 W/cm², the sheath potential of 1080 V, Ar pressure of $5 \times 10^{-3}$ Torr, the etching time period of 30 – 100 min., the substrate temperature of about 300° C, and the etching ate of $SiO_2$ of 127°A/min., are shown.

In Table 2, relative etching rates which are measured when the materials are etched by the ion milling method whose conditions are: the ion energy of 1.0KeV, the current density of 1.0mA/cm², Ar pressure of $5 \times 10^{-3}$ Torr, the substrate temperature of about 300° C, and the etching rate of $SiO_2$ of 300°A/min.

Table 1

| Materials | Relative Etching Rate |
|---|---|
| $SiO_2$ | 1.0 |
| PSG (formed by Chemical Vapor Deposition Method, $P_2O_5$ 1.2%) | 1.0 |
| Si | 1.2 |
| $Si_3N_4$ (formed by Chemical Vapor Deposition Method) | 0.83 |
| Al | 12 1 – 1.8 |
| KTFR | 0.75 – 2.5 |
| KMER | 0.75 – 2.0 |
| AZ 1350 | 0.7 – 1.0 |
| AZ 135OH | 0.9 – 2.0 |
| Waycote | 1.2 |
| Polyimide Resin | 0.8 |
| Polyimide-iso-indroquinazolinedione Resin | 0.8 |

Table 2

| Materials | Relative Etching Rate |
|---|---|
| $SiO_2$ | 1.0 |
| PSG (formed by Chemical Vapor Deposition Method, $P_2O_5$ 1.2%) | 1.0 |
| Si | 0.9 |
| Al | 1.1 – 1.5 |
| KTFR | 0.95 |
| KMER | 1.0 |
| AZ 1350 | 1.5 |
| Polyimide Resin | 1.0 |
| Polyimide-iso-indroquinazolinedione Resin | 1.0 |
| Poly(methyl methacrylate) | 2.1 |

FIGS. 3a to 3f are sectional views for explaining one embodiment of the present invention.

Figure 3A:
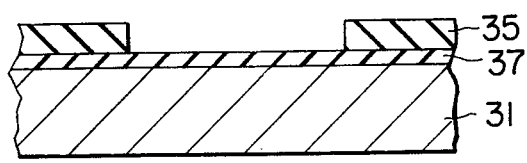
FIGS. 3a to 3f are schematic sectional views of a semiconductor device for explaining one embodiment of the present invention.
Figure 3B:
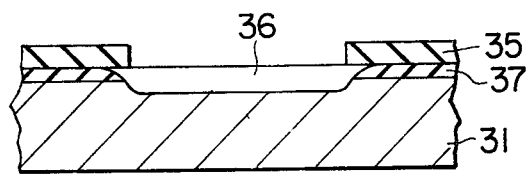
Figure 3C:
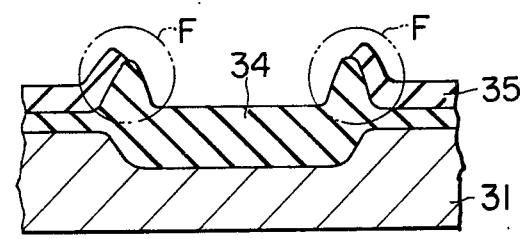

On a surface of a Si body 31, $SiO_2$ film 37 and $Si_3N_4$ film 35 are successively formed and $Si_3N_4$ film 35 is selectively etched (FIG. 3a). Then the $SiO_2$ film 37 is etched by utilizing the selectively etched $Si_3N_4$ film 35 as a mask, whereby the selective portion of the Si body 31 is exposed (FIG. 3b). A numeral 36 shows etched portions of the $SiO_2$ film 37 and of the Si body 31. The exposed surface of the Si body 31 is then oxidized in a dry oxygen at a temperature of about 1000° C for 20 hours, whereby $SiO_2$ layer 34 is formed. At this stage, peripheral portions of the $SiO_2$ layer 34 becomes to have protuberances F as shown in FIG. 3c, since the volume of Si expands when it becomes $SiO_2$. The thickness of the protuberance F is usually about 0.5 – 1.2μm.

Figure 3D:
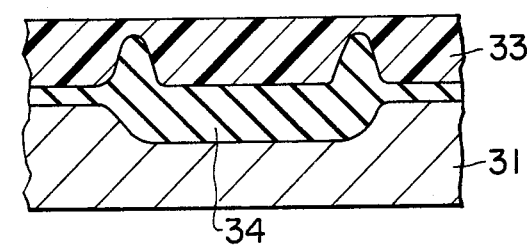

After the $Si_3N_4$ film 35 is removed, a photoresist of KTFR is applied on the surfaces of the $SiO_2$ layer and of the $SiO_2$ film 37 by a rotor running at 3000 rpm so that the thickness of KTFR becomes 1.5μm, and is pre-baked at a temperature of about 70° C, exposed by ultraviolet light, developed and post-baked at a temperature of about 100° – 200° C, whereby the layer 33 of KTFR is formed as shown in FIG. 3d.

Figure 3E:
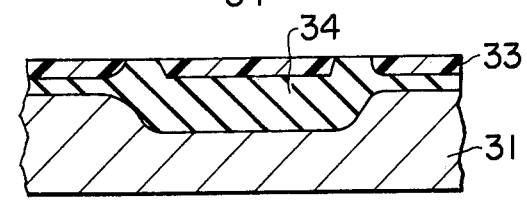

Thus formed device is then subjected to the rf sputtering etch under conditions of the rf power of $2W/cm^2$, the sheath potential of 700V, Ar pressure of $5 \times 10^{-3}$ Torr, and the substrate temperature of 150° C. Under these conditions, the etching rates of the $SiO_2$ layer 34 and of the KTFR layer 33 are 1.5 – 2A/sec and 1.2 – 1.5A/sec, respectively. Although the etching rate of the KTFR layer is lower than that of the $SiO_2$ layer by about 15% of the etching rate of the $SiO_2$ layer, the surface of the substrate is etched keeping its surface even, as shown in FIG. 3e. When the etching is continued for about 190 minutes, all of the KTFR layer 33 and the protuberances F of the $SiO_2$ layer 34 are etched away, and the surface of the $SiO_2$ layer 34, that is the surface of the substrate becomes even.

Figure 3F:
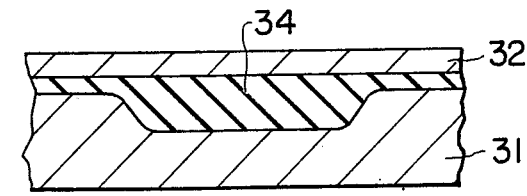

On the surface of thus formed substrate, a conductive layer 32 is formed as shown in FIG. 3f. This conductive layer 32 has a high reliability, since it is formed on the even surface of the substrate and hence no breaks thereof are caused.

This resultant device has other advantages as follows.

In the conventional devices, when the conductivity layer of Al is formed on the substrate surface which has an unevenness of about 0.5μm, the thickness of the conductive layer should be about 0.8 – 1μm for keeping the reliability, and when the conductive layer is subjected to the minute processing utilizing the photoetching technique, it becomes difficult to obtain fine patterns for the conductive layer, since the light for exposing the photoresist, which was passed through mask patterns, is reflected by the uneven surface of the substrate. Because of these facts, in the conventional devices, the distance between two conductive layers and the width of the conductive layer become 4 – 6μm and 8 – 10μm, respectively, when the thickness of the conductive layer is 1μm. Therefore, it becomes difficult to increase the integration density of the conductive layers and hence of the semiconductor devices. On the other hand, according to the present invention, since it becomes possible to make the thickness of the conductive layer as thin as possible, such as 0.5μ, and to make the distance between the conductive layers and the width of the conductive layer 2 – 3μm and 4 – 6μm, respectively, the integration density of the conductive layers and hence of the semiconductor devices is increased greatly.

Figure 4:
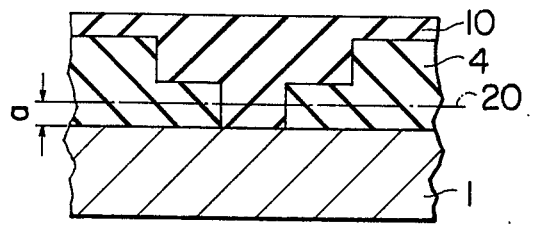
FIG. 4 is a schematic sectional view of a semiconductor device for explaining another embodiment of the present invention.

FIG. 4 is a sectional view for explaining another embodiment of the present invention.

The device shown in FIG. 4 is an enlarged view of the device shown in FIG. 1d from which the conductive layer 7 is removed, and, in FIG. 4, diffused regions 5 and 6 are omitted and KTFR layer 10 is added.

As stated above with reference to FIGS. 1a to 1d, the reliability of the wiring 7 and hence of the semiconductor device becomes low. This desadvantage, however, is easily solved when the present invention is adopted to the conventional method.

KTFR layer 10 is formed by the steps described in the above embodiment so that the thickness of the KTFR layer 10 is at least same as that of the $SiO_2$ film 4. The resultant device is shown in FIG. 4.

Then the resultant device is subjected to the rf sputtering etch and the KTFR layer 10 and the $SiO_2$ film 4 are etched until the surfaces of the KTFR layer 10 and of the $SiO_2$ film 4 which are defined by the line 20 in FIG. 4 are exposed.

When the remained portion of the KTFR layer 10 is completely removed and a conductive layer is formed, the reliability of the formed conductive layer becomes high.

FIGS. 5a to 5d are sectional views for explaining a further embodiment of the present invention.

Figure 5A:
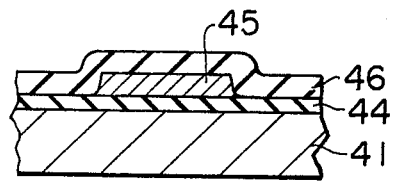
FIGS. 5a to 5d are schematic sectional views of a semiconductor device for explaining further embodiment of the present invention.

On a semiconductor body 41, $SiO_2$ layer 44 is formed. A first conductive layer 45 of Al having a thickness of 0.5 – 1μm is formed on the $SiO_2$ layer 44 and on the first conductive layer 45 and on the surface of the $SiO_2$ layer 44, another $SiO_2$ layer 46 having a thickness of 0.5 – 1μm is formed (FIG. 5a).

Figure 5B:
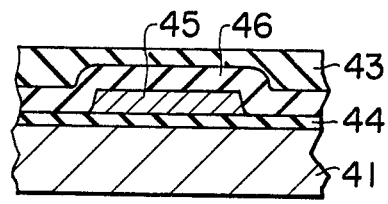

A polyimide resin layer 43 having a thickness of 1 – 2μm is formed on said another $SiO_2$ layer 46 by applying a prepolymer of polyimide resin on said another $SiO_2$ layer 46 by a rotor running at 3000 rpm and heating the prepolymer in $N_2$ gas at a temperature of 350° C for 1 hour (FIG. 5b).

Then the resultant device is subjected to the ion milling. Conditions of the ion milling are: the ion energy of 7KeV, the ion current of $1.4mA/cm^2$, the degree of vacuum of $5 \times 10^{-5}$ Torr, and the substrate temperature of 150° C. Under these conditions, the etching rates of $SiO_2$ and of the polyimide resin are 3 – 4A/sec and 4 – 4.5A/sec, respectively.

Figure 5C:
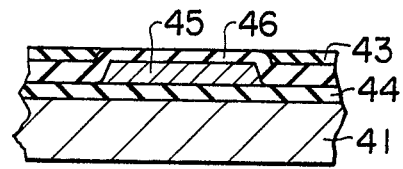

FIG. 5c is a sectional view of the semiconductor device in the midway of the ion milling. The ion milling is continued until the surface of the first conductive layer 45 is exposed. In this state, the surface of said another $SiO_2$ 46 consists with the surface of the first conductive layer 45.

Figure 5D:
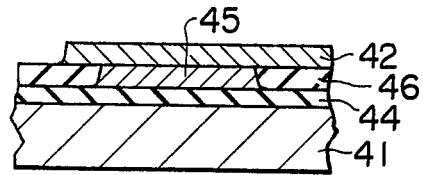

When, on the even surface of the substrate as shown in FIG. 5c, aluminum is evaporated so that the thickness of the aluminum is 0.7 – 1.0μm, and the evaporated aluminum is selectively etched, a second conductive layer 42 is formed (FIG. 5d).

Repeating these steps, a semiconductor device having multi-level interconnections can be obtained.

Figure 6:
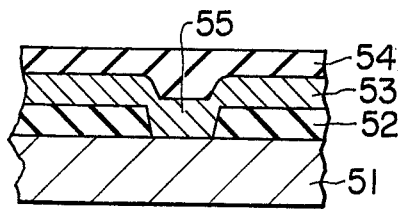
FIG. 6 is a schematic sectional view of a semiconductor device for explaining still further embodiment of the present invention.

FIG. 6 is a sectional view for explaining a still further embodiment of the present invention.

On a semiconductor body 51, $SiO_2$ layer 52 having a through hole 55 at a predetermined portion thereof is formed. A conductive layer of Al is then formed on the surface of the $SiO_2$ layer 52 and on the surface of the semiconductor body 51 exposed by the through hole 55. The Al layer 53 has a dent at a corresponding portion to the through hole 55, and hence there are steps at a peripheral portion of the dent.

For eliminating these steps, the present invention is adopted.

On the surface of the Al layer 53, AZ 1350 is applied by a conventioal applying steps so that the thickness of the AZ 1350 layer 54 is at least the same as the height of the step (FIG. 6). Then the resultant device is subjected to the ion milling whose conditions are the same as those in the embodiment described above. The ion milling is continued until the surface of the $SiO_2$ layer 52 is exposed. Since the etching rates of AZ1350 and of Al are nearly equal, the exposed surface of the Al layer 53 due to the ion milling consists with the exposed surface of the SiO$_2$ layer 52, and hence the even surface of the substrate is obtained.

On the even surface of the substrate, an aluminum layer is formed and is etched so as to have a predetermined pattern.

When other interconnection layers are required for obtaining multi-level interconnections, the above mentioned steps may be repeated.

Although the preferred embodiments of the present invention have been described above, the present invention is not limited to those embodiments.

For example, although materials for the layer formed on the uneven surface of the substrate are KTFR, polyimide and AZ 1350 in the embodiments, other materials which have almost same etching rates as the etching rate of a material composing the substrate surface may be used.

Moreover, although the SiO$_2$ layer is utilized for the insulating material on the semiconductor body and between the multi-level interconnections, other insulating materials, such as PSG, BSG, and Si$_3$N$_4$, may be utilized for the present invention.

While the present invention has been shown and described in terms of the best mode contemplated for carrying out the invention, it will be appreciated that changes and modifications can be made which do not depart from the inventive concepts taught herein. Such changes and modifications are deemed to be within the purview of the present invention.

What is claimed is:

1. A method for fabricating a semiconductor device comprising the steps of:
    applying a layer of liquid material to an uneven surface of a substrate to a thickness sufficient to form an even-surfaced layer covering the uneven surface of said substrate;
    converting said layer of liquid material to a layer of solid material which has about the same etching rate with respect to a physical etching utilizing ions as the material composing the surface of said substrate; and
    etching said layer of solid material and the surface of said substrate covered thereby with said physical etching utilizing ions, so as to expose a predetermined portion of the surface of said substrate.

2. A method for fabricating a semiconductor device according to claim 1, wherein said substrate surface consists of a material selected from the group consisting of Si, SiO$_2$, phospho-silicate glass, boro-silicate glass, Si$_3$N$_4$ and aluminum.

3. A method for fabricating a semiconductor device according to claim 2, wherein said substrate surface consists of a material of Si.

4. A method for fabricating a semiconductor device according to claim 2, wherein said substrate surface consists of a material selected from the group consisting of SiO$_2$, Si$_3$N$_4$, phospho-silicate glass and boro-silicate glass.

5. A method for fabricating a semiconductor device according to claim 2, wherein said substrate surface consists of a material of aluminum.

6. A method for fabricating a semiconductor device according to claim 2, wherein said layer consists of a material selected from the group consisting of negative-type photoresists, positive-type photoresists, positive-type resists for electron beams, negative-type resists for electron beams, polyimide resin, polyimide-isoindroquinazolinedione and low temperature fusible glass being able to be coated.

7. A method for fabricating a semiconductor device according to claim 6, wherein said positive-type resists for electron beams are selected from the group consisting of poly(methyl methacrylate) and poly(butene-1 sulfon), and wherein said negative-type resists for electron beams are selected from the group consisting of epoxidized polybutadiene, copolymer of glycidyl methacrylate and ethyl acrylate, and poly(glycidyl methacrylate).

8. A method for fabricating a semiconductor device according to claim 3, wherein said layer consists of a material selected from the group consisting of negative-type photoresists, positive-type photoresists, poly(methyl methacrylate), poly(butene-1 sulfon), epoxidized polybutadiene, copolymer of glycidyl methacrylate and ethyl acrylate, and poly(glycidyl methacrylate).

9. A method for fabricating a semiconductor device according to claim 4, wherein said layer consists of a material selected from the group consisting of negative-type photoresists, polyimide resin and polyimide-isoindroquinazolinedione.

10. A method for fabricating a semiconductor device according to claim 5, wherein said layer consists of a material selected from the group consisting of positive-type photoresists, poly(methyl methacrylate), poly(butene-1 sulfon), epoxidized polybutadiene, copolymer of glycidyl methacrylate and ethyl acrylate, and poly (glycidyl methacrylate).

11. A method for fabricating a semiconductor device according to claim 1, wherein said physical etching is selected from the group consisting of a sputter etching and an ion milling.

12. A method for fabricating a semiconductor device according to claim 11, wherein said physical etching is an rf sputter etching wherein conditions are an rf power of 0.2 –10 W/cm$^2$, a sheath potential of lower than 2000 V, Ar pressure of $5 \times 10^{-2} - 1 \times 10^{-4}$ Torr., an oxygen concentration of lower than 0.1%, and a substrate temperature of lower than melting temperature of the material of said layer.

13. A method for fabricating a semiconductor device according to claim 12, wherein said rf power is between 0.2 W/cm$^2$ and 5 W/cm$^2$, said sheath potential is between 700 V and 1500 V, and said substrate temperature is between 100° C and 200° C.

14. A method for fabricating a semiconductor device according to claim 11, wherein said physical etching is an ion milling wherein conditions are an ion energy of 20 eV – 90 KeV, a degree of vacuum of $1 \times 10^{-3} - 5 \times 10^{-6}$ Torr., a current density of 0.5 – 5 mA/cm$^2$, and a substrate temperature of lower than melting temperature of the material of said layer.

15. A method for fabricating a semiconductor device according to claim 14, wherein said ion energy is between 20 eV and 30 Kev, and said substrate temperature is between 100° C and 200° C.

16. A method for fabricating a semiconductor device according to claim 15, wherein said ion energy is between 3 Kev and 10 Kev.

* * * * *